United States Patent [19]

Yokoyama

[11] 4,357,578
[45] Nov. 2, 1982

[54] COMPLEMENTARY DIFFERENTIAL AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 190,610

[22] Filed: Sep. 25, 1980

[30] Foreign Application Priority Data

Oct. 5, 1979 [JP] Japan .............................. 54-138097[U]
Oct. 30, 1979 [JP] Japan .............................. 54-150438[U]

[51] Int. Cl.³ .............................................. H03F 3/45
[52] U.S. Cl. ...................................... 330/252; 330/263
[58] Field of Search ................ 330/252, 261, 262, 263

[56] References Cited

U.S. PATENT DOCUMENTS 3,497,824  2/1970  Goordman .......................... 330/261

*Primary Examiner*—James B. Mullins
*Assistant Examiner*—Gene Wan

*Attorney, Agent, or Firm*—Frishauf, Holtz, Goodman and Woodward

[57] ABSTRACT

A complementary differential amplifier comprises a first differential amplifier circuit having first conductivity type differential transistors and a second differential amplifier circuit having second conductivity type differential transistors. To improve a dynamic range and a slew rate of the complementary differential amplifier and, to prevent of the generation of TIM distortion with a simple construction, a constant voltage circuit is connected between commonly connected electrodes of differential transistors of the first differential amplifier circuit and commonly connected electrodes of differential transistors of the second differential amplifier circuit. To improve a slew rate in a high frequency range and to prevent the generation of TIM distortion, a capacitor may be connected between the commonly connected electrodes of the differential transistors of the first differential amplifier and the commonly connected electrodes of the differential transistors of the second differential amplifier.

7 Claims, 9 Drawing Figures

COMPLEMENTARY DIFFERENTIAL AMPLIFIER

BACKGROUND OF THE INVENTION

The present invention generally relates to a differential amplifier used mainly for audio circuits and, more particularly, to a complementary differential amplifier having a pair of differential amplifier circuits operating in a complementary manner.

Complementary differential amplifiers, which are superior to conventional differential amplifiers with a pair of amplifying elements, have recently been used in audio circuits. An example of the conventional complementary differential amplifiers is shown in FIG. 1. The complementary differential amplifier circuit is comprised of a first differential amplifier circuit 3 having NPN type transistors 1 and 2 and a constant current source 7 (current value Ie) and a second differential amplifier circuit 6 having PNP transistors 4 and 5 and a constant current source 8 (current value Ie). Assuming that the collector current of the transistor 1 is Ia, the collector current of the transistor 4 is Ib, and a difference between the two input voltages V1 and V2 is Vi ($Vi = V1 - V2$), its operation characteristics are depicted as shown in FIG. 2. In FIG. 2, a broken line A designates the current Ia of the first differential amplifier 3, a broken line B the current Ib of the second differential amplifier 6, a continuous line C the sum of the currents Ia and Ib. The slopes of the broken lines A and B used for an output current are each given by 1/2R1 where R1 is the resistance value of resistors 9, 10, 11 and 12, and the slope of the continuous line by 1/R1. Further, points P1 and P2 denote the values of the current Ia and Ib in no input signal condition (Vi=0).

In the complementary differential amplifier, when the input voltge Vi exceeds $\pm R1 \times Ie$, the output current saturates at a magnitude of Ie or −Ie. Therefore, the dynamic range and the slew rate of the circuit is small and when the circuit is used for the first stage of a negative feedback circuit in such a manner that the feedback signal is applied as the input voltage V2, TIM (transient intermodulation) distortion tends to occur.

To increase the saturation output current, there is proposed a complementary differential amplifier as shown in FIG. 3. In the circuit of FIG. 3, when input voltage Vi (V1−V2)>0, the output current flows through transistors 15 and 16, while when Vi<0, the output current flows through transistors 17 and 18. Therefore, the maximum output current is allowed up to 2Vc/2R2 (Vc: the voltage of each of DC power sources 19; and 20 and R2: the value of resistors 21 to 24). This circuit, however, requires separate constant voltage bias circuits 25 and 26 in the input circuit. Further, those circuits must be precisely matched with each other. Thus, the conventional complementary differential amplifier needs separate bias circuits, resulting in complicated and uneconomical circuit construction.

SUMMARY OF THE INVENTION

Accordingly, an object of the present invention is to provide a complementary differential amplifier which is improved in the dynamic range, slew rate and TIM distortion with a simple construction.

According to one aspect of the present invention, a common constant voltage circuit is connected between commonly connected electrodes of differential transistors of a first conductivity type in a first differential amplifier circuit and commonly connected electrodes of differential transistors of a second conductivity type in a second differential amplifer circuit.

According to another aspect of the present invention, a capacitor is connected between commonly connected of electrodes of the differential transistors of the first differential amplifier circuit and commonly connected of electrodes of the differential transistors of the second differential amplifier circuit.

DETAILED DESCRIPTION OF THE PREFERRED EMBODIMENTS

Figure 4:
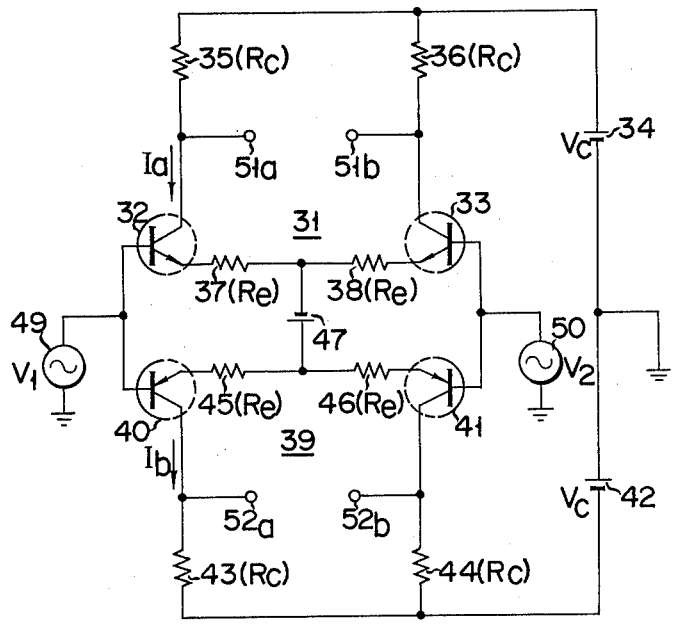
FIG. 4 shows a schematic circuit diagram of a complementary differential amplifier according to one embodiment according to the present invention.

Referring to FIG. 4, there is shown a basic circuit configuration of the complementary differential amplifier according to the present invention. In FIG. 4, a first differential amplifier circuit 31 is comprised of NPN type transistors 32 and 33 (first and second amplifying elements), resistors 35 and 36 (Rc) respectively connecting the collectors of transistors 32 and 33 to the positive terminal of a DC power source 34 (Vc), and resistors 37 and 38 (Re) connected between the emitters of transistors 32 and 33. A second differential amplifier circuit 39, which operates with respect to the first differential amplifier circuit 31 in complementary fashion, is comprised of PNP transistors 40 and 41 (third and fourth amplifying elements), resistors 43 and 44 (Rc) respectively connecting the collectors of transistors 40 and 41 to the negative terminal of a DC power source 42 (Vc), and resistors 45 and 46 (Re) connected between the emitters of transistors 40 and 41. A DC power source 47 (constant voltage circuit) is connected between the connection point between the resistors 37 and 38 and the connection point between the resistors 45 and 46. By the DC power source 47, a potential difference between the commonly connected emitters of the transistors 32 and 33 and the commonly connected emitters of the transistors 40 and 41 is kept constant. A signal from a signal source 49 (V1) is applied to the respective bases of the transistors 32 and 40. A signal from a signal source 50 (V2) is supplied to the bases of the transistors 33 and 41. A first output signal appears between output terminals 51a and 51b. A second output signal whose phase is opposite to that of the first output signal appears between output terminals 52a and 52b. The negative terminal of the DC power source 34 and the positive terminal of the DC power source 42 are both connected to ground.

Figure 5:
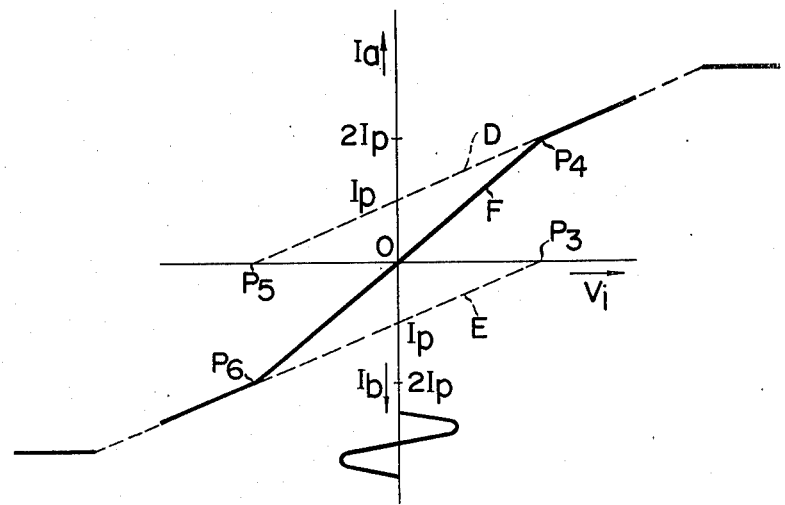
FIG. 5 shows operating characteristics of the circuit shown in FIG. 4.

The operation of the complementary differential amplifier thus constructed will be described referring to FIG. 5. In FIG. 5, the ordinate represents the collector currents Ia and Ib of the transistors 32 and 40 and the abscissa represents the difference voltage $Vi(=V1-V2)$ between the input voltages V1 and V2 from the signal sources 49 and 50. In the figure, broken lines D and E designate changes of the currents Ia and Ib with respect to the voltage Vi. A continuous line F designates a change of the sum (Ia+Ib) of the currents Ia and Ib.

When Vi=0, that is, in the no signal input condition, the currents Ia and Ib are both equal to a current Ip- (Ia=Ib=Ip) determined by the voltage of the DC power source 47 and the resistance value Re. In this case, the collector current of the transistors 33 and 41 are equal to Ip. Then, when Vi>0, the transistors 32 and 41 are biased to be more conductive, while the transistord 33 and 40 are biased to be less conductive. Then, the voltage Vi increases to Vi=2Ip×Re. At this time, the transistors 33 and 40 are both cut off (see a point P3 in FIG. 5) and the current Ia becomes 2Ip (see a point P4) which flows through the transistor 32, the DC power source 47and the transistor 41. When the input voltage Vi more increases, the current Ia flows through the transistor 32, the DC power source 47, and the transistor 41, in accordance with the mutual conductance gm=½Re and without being saturated.

When Vi<0, the transistors 32 and 41 are biased to be less conductive and the transistors 33 and 40 are biased to be more conductive. When Vi=−2Ip×Re, the transistors 32 and 41 are cut off (see a point P5) and the current Ib becomes 2Ip (see a point P6). When the voltage Vi further decreases, the current Ib flows through the transistor 33, the DC power source 47, and the transistor 40, in accordance with the mutual conductance gm=½Re and without being saturated.

When the currents Ia and Ib flow in this way, the sum (Ia+Ib) flows as indicated at the continuous line F in FIG. 5. When Vi<−2Ip×Re, the sum Ia+Ib becomes equal to the current Ib. When −2Ip×Re<Vi<2Ip×Re, it flows depending on the mutual conductance gm=1/Re. When Vi>2Ip×Re, it is equal to the current Ia. The circuit arrangement as described above may produce the output current up to ±2Vc/2Rc.

Figure 6:
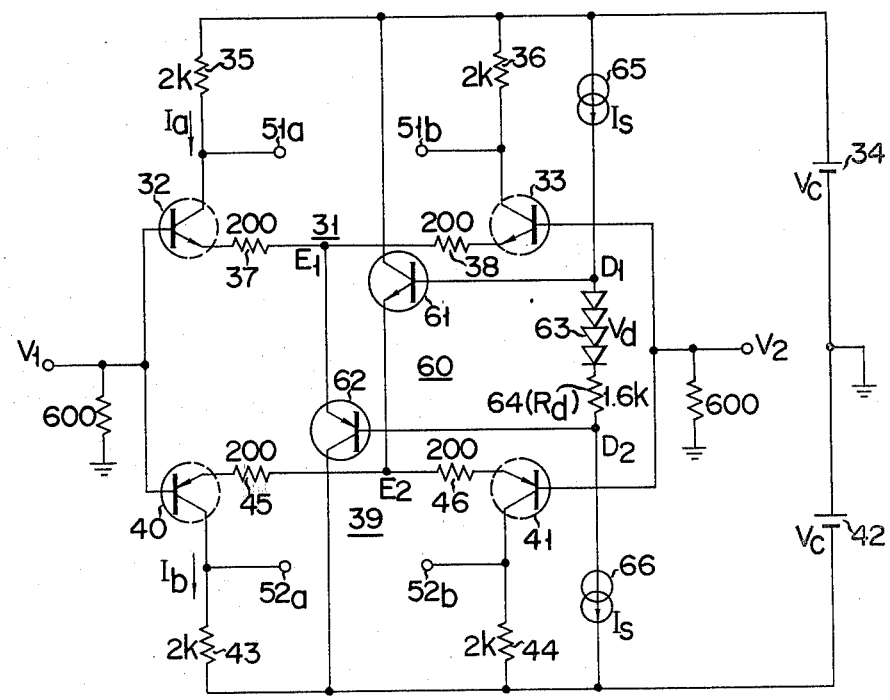
FIG. 6 shows a practical circuit arrangement of the circuit shown in FIG. 4.

Turning now to FIG. 6, there is shown a practical arrangement of the present invention. In FIG. 6, like numerals designate like portions of FIG. 4.

In the circuit shown in FIG. 6, a constant voltage circuit 60 is used in place of the DC power source 47 of FIG. 4. The constant voltage circuit 60 is comprised of transistors 61 and 62, a diode unit (constant voltage source) 63 having four series-connected diodes, a resistor 64 (Rd), and constant current circuits 65 and 66 each having a current value Is for providing a constant current Is to the diode unit 63 and the resistor 64. Assuming that the connection point between resistors 37 and 38 is denoted as E1, the connection point between resistors 45 and 46 as E2, the connection point between the constant current circuit 65 and the diode unit 63 as D1 and the connection point between the resistor 64 and the constant current circuit 66 as D2, the potential at the point E1 is equal to the potential at the point D2 plus $V_{BE}$ voltage between the base and emitter of the transistor 62. The potential at the point E2 is equal to the potential at the point D1 minus $V_{BE}$ voltage between the base and emitter of the transistor 61. Both the transistors 61 and 62 are used in the voltage follower manner. The voltage between the points D1 and D2 is the sum of the voltage Vd across the diode unit 63 and the voltage drop Is×Rd across the resistor 64 which is constant as given by $$Vd + Is \times Rd$$

Therefore, the voltage between the points E1 and E2 is always a fixed value given below $$Vd + Is \times Rd - 2V_{BE}$$

The voltage is approximately 2V.

The diode unit 63 is used for temperature compensation of the circuit. Specifically, the base current of the transistors 61 and 62 flows through a path led from the point D1 through the base-emitter junction of the transistor 61, the resistor 46, the base-emitter junction of the transistor 41, the base-emitter junction of the transistor 33, the resistor 38, and the base-emitter junction of the transistor 62 to the point D2. The diode unit 63 compensates for variations of the base-emitter voltages of the transistors 61, 41, 33 and 62 due to temperature change.

Figure 1:
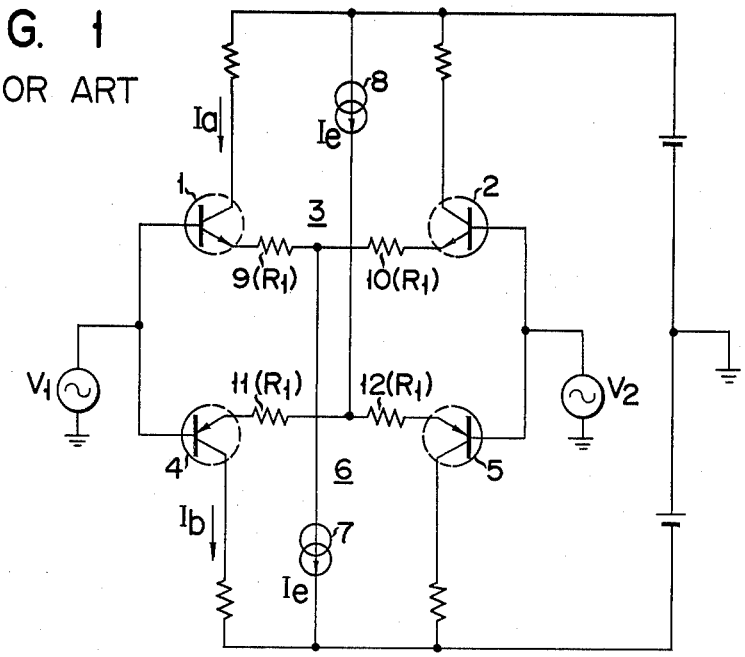
FIG. 1 shows a schematic circuit diagram of a conventional complementary differential amplifier.
Figures 7, 8, 9:
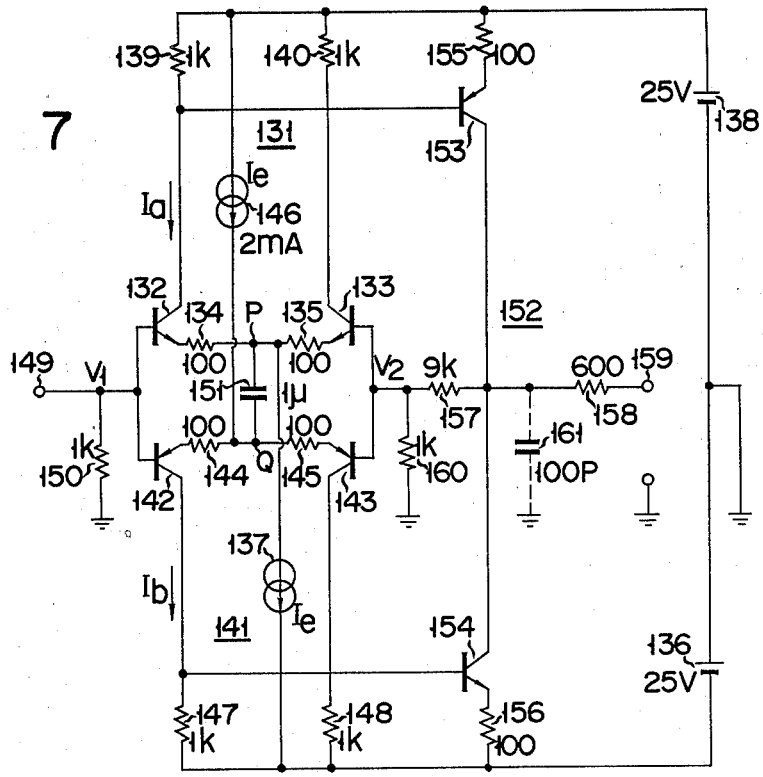
FIG. 7 shows a circuit diagram of the complementary differential amplifier according to another embodiment of the present invention.
FIGS. 8 and 9 show equivalent circuits of the complementary differential amplifier circuit shown in FIG. 7 for low frequency signals and high frequency signals, respectively.

Turning now to FIG. 7, there is shown another embodiment of the present invention. In FIG. 7, a first differential amplifier circuit 131 is comprised of NPN type transistors 132 and 133, resistors 134 and 135 connected in series between the emitters of transistors 132 and 133, a constant current circuit 137 connected between the common emitter (a point P in the figure) of the transistors 132 and 133 and a negative terminal of a DC power source 136, and resistors 139 and 140 respectively connected between the collectors of the transistors 132 and 133 and a positive terminal of a DC power source 138. A second differential amplifier circuit 141 is comprised of PNP type transistors 142 and 143, resistors 144 and 145 connected in series between the emitters of transistors 142 and 143, a constant current circuit 146 between the common emitter (a point Q in the figure) of the transistors 142 and 143 and the positive terminal of the DC power source 138, and resistors 147 and 148 connected between the collectors of the transistors 142 and 143 and the negative terminal of the DC power source 136. The respective bases of the transistors 132 and 142 are commonly connected to an input terminal 149 and to ground through a resistor 150. The respective bases of transistors 133 and 143 are commonly connected to each other. The circuit construction as mentioned above is the same as the conventional complementary differential amplifier circuit shown in FIG. 1. In this embodiment, a capacitor 151 is connected between the common emitter (point P) of the transistors 132 and 133 and the common emitter (point Q) of the transistors 142 and 143.

The collectors of transistors 132 and 142 are connected to the bases of transistors 153 and 154 forming an output stage amplifier circuit 152, respectively. The emitter of transistor 153 is connected to the positive terminal of the DC power source 138 through a resistor 155. The emitter of transistor 154 is connected to the negative terminal of the DC power source 136 through a resistor 156 and the collectors of transistors 153 and 154 are connected to the commonly connected bases of transistors 133 and 143 through a negative feedback resistor 157 and are connected to an output terminal 159 via a resistor 158. Further, between the commonly connected bases of transistors 133 and 143 and ground is connected a resistor 160. A capacitor 161 is an equivalent expression of various delay elements causing the TIM distortion or deterioration of the dynamic range and the slew rate.

The operation of the circuit shown in FIG. 7 will be described.

When the frequency of the input signal V1 applied to the input terminal 149 is low, the impedance of the capacitor 151 for the input signal becomes high, with the result that an AC equivalent circuit of the major part of the complementary differential amplifier circuit is as shown in FIG. 8, having no capacitor. Accordingly, the complementary differential amplifier circuit operates in exactly the same manner as the conventional one (see FIG. 1). To be more specific, the input signal V1 is amplified with opposite polarities by the first and second differential amplifier circuits 131 and 141 and applied to the bases of the transistors 153 and 154. The signal is further amplified by the transistors 153 and 154 and then is outputted from the output terminal 159 via a resistor 158.

Figure 2:
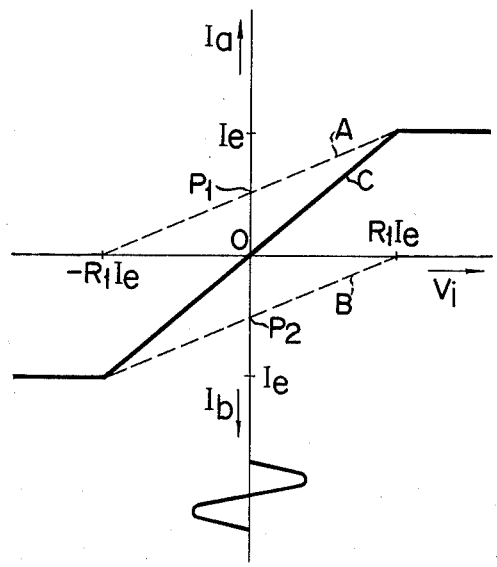
FIG. 2 shows operating characteristics of the circuit shown in FIG. 1.
Figure 3:
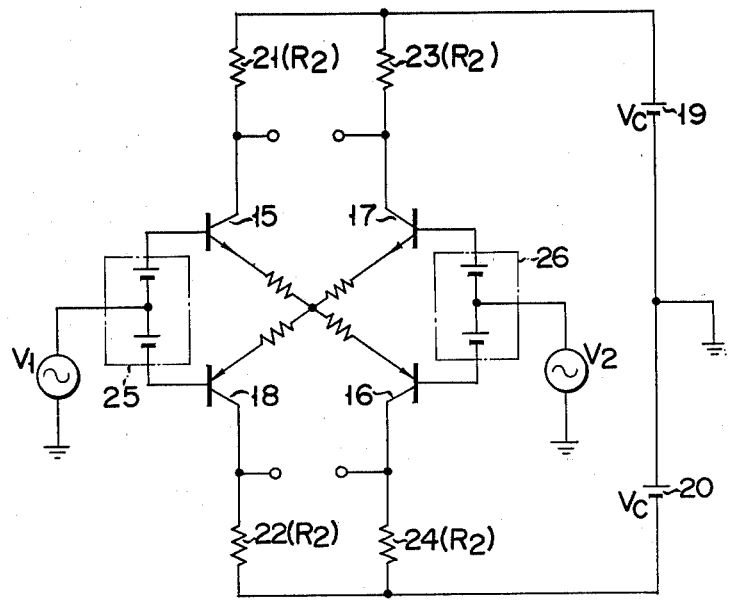
FIG. 3 shows a schematic circuit diagram of another conventional complementary differential amplifier.

The currents Ia and Ib flowing through the collectors of the transistors 132 and 142 change as indicated at A and B in FIG. 2 with respect to a change of the input signal Vi. The input signal Vi is a signal ($Vi = V1 - V2$) representing a difference between the input signal V1 applied to the input terminal 149 and a signal (feedback signal) applied to the commonly connected bases of the transistors 133 and 143. As shown in FIG. 2, the currents Ia and Ib saturate at a point that their currents reach the current Ie of each of the constant current circuits 137 and 146. The TIM distortion, however, arises from the fact that when the input signal frequency is high, the feedback signal V2 cannot follow the input signal V1 due to the presence of the delay element 161 and the transistors 132 or 142, therefore, are saturated. Therefore, when the frequency of the input signal V1 is low, there is never produced the TIM distortion even if the complementary differential amplifier circuit has the characteristic as shown in FIG. 2.

On the other hand, when the frequency of the input signal V1 applied to the input terminal 149 is high, the impedance of the capacitor 151 for the input signal V1 is low. As a result, an equivalent circuit of the major part of the complementary differential amplifier circuit is the one with the points P and Q short circuited, as shown in FIG. 9. In this case, when the input signal V1 is positive, the collector current Ia of the transistor 132 flows through the constant current circuit 137 and further through the capacitor 151 and the transistor 143, thereby to prevent the transistor 132 from being saturated. When the input signal V1 is negative, the collector current Ib of the transistor 142 flows through the constant current circuit 146 and further through the capacitor 151 and the transistor 133, thereby to prevent the transistor 142 from being saturated. The characteristics of the currents Ia, Ib and the sum (Ia+Ib) of the currents Ia and Ib with respect to the input signal Vi ($Vi = V1 - V2$) are as indicated by the broken lines D, E and the continuous line F of FIG. 5. Therefore, the TIM distortion in high frequencies may be prevented and the dynamic range and the slew rate may be improved.

The complementary differential amplifier according to the present invention may use field effect transistors in place of the bipolar transistors which are used in the above-mentioned embodiments. The load circuits of the first and second differential amplifiers may be constructed by a current mirror circuit in place of the load resistor circuit as shown. Further, the respective resistors connected to the emitters of the differential transistors are not essential to the present invention. When the differential transistors are completely matched, the resistors may be omitted.

What is claimed is:

1. A complementary differential amplifier comprising: a first differential amplifier circuit including:
   first and second amplifying elements of a first conductivity type, each of said first and second amplifying elements having a control electrode and first and second electrodes; and
   first and second resistors connected in series between said second electrodes of said first and second amplifying elements, a common connecting point being defined between said first and second resistors;
a second differential amplifier circuit including:
   third and fourth amplifying elements of a second conductivity type which is opposite to said first conductivity type, each of said third and fourth amplifying elements having a control electrode and first and second electrodes; and
   third and fourth resistors connected in series between said second electrodes of said third and fourth amplifying elements, a common connecting point being defined between said third and fourth resistors;
said first, second, third and fourth resistors each having substantially the same resistance value;
a constant voltage circuit connected between said common connecting point between said first and second resistors and said common connecting point between said third and fourth resistors;
a first input terminal connected to said control electrodes of said first and third amplifying elements;
a second input terminal connected to said control electrodes of said second and fourth amplifying elements;
a first output terminal connected to at least one of said first electrodes of said first and second amplifying elements; and
a second output terminal connected to at least one of said first electrodes of said third and fourth amplifying elements.

2. The complementary differential amplifier according to claim 1, wherein said constant voltage circuit comprises diodes, and means for feeding current with said diodes.

3. The complementary differential amplifier according to claim 1, wherein said constant voltage circuit comprises a capacitor.

4. The complementary differential amplifier according to claim 3, wherein said first through fourth amplifying elements comprise respective transistors, the complementary differential amplifier further comprising:
   a first constant current circuit connected to said common connection point between said first and second resistors; and
   a second constant current circuit connected to said common connection point between said third and fourth resistors.

5. A complementary differential amplifier comprising:
   a first differential amplifier circuit having first and second transistors of a first conductivity type, each of said first and second transistors having a base, an emitter and a collector, said emitters of said first and second transistors being commonly connected to each other through first and second resistors which are connected in series, a common connection point being defined between said first and second resistors;

a second differential amplifier circuit having third and fourth transistors of a second conductivity type which is opposite to said first conductivity type, each of said third and fourth transistors having a base, an emitter and a collector, said emitters of said third and fourth transistors being commonly connected to each other through third and fourth resistors which are connected in series, a common connection point being defined between said third and fourth resistors, said base of said third transistor being connected to said base of said first transistor, and said base of said fourth transistor being connected to said base of said second transistor;

said first, second, third and fourth resistors each having substantially the same resistance value;

a constant voltage circuit including a constant voltage source having two ends, a first voltage follower circuit connected between said common connection point between said first and second resistors and one end of said constant voltage source, and a second voltage follower circuit connected between said common connection point between said third and fourth resistors and the other end of said constant voltage source;

a first input terminal connected to said bases of said first and third transistors;

a second input terminal connected to said bases of said second and fourth transistors;

a first output terminal connected to at least one of said collectors of said first and second transistors; and a second output terminal connected to at least one of said collectors of said third and fourth transistors.

6. The complementary differential amplifier according to claim 5, wherein said constant voltage source comprises diodes, and there is further provided means for feeding current to said diodes.

7. A complementary differential amplifier comprising:

a first differential amplifier circuit having first and second transistors of a first conductivity type, each of said first and second transistors having a base, an emitter and a collector, said emitters of said first and second transistors being commonly connected to each other through first and second resistors which are connected in series, a common connection point being defined between said first and second resistors;

a second differential amplifier circuit having third and fourth transistors of a second conductivity type which is opposite to said first conductivity type, each of said third and fourth transistors having a base, an emitter and a collector, said emitters of said third and fourth transistors being commonly connected to each other through third and fourth resistors which are connected in series, a common connection point being defined between said third and fourth resistors, said base of said third transistor being connected to said base of said first transistor, and said base of said fourth transistor being connected to said base of said second transistor;

said first, second, third and fourth resistors each having substantially the same resistance value;

a constant voltage circuit including a plurality of diodes, means for feeding current with said diodes, a fifth transistor of said second conductivity type and having a base-emitter path connected between said common connecting point between said first and second resistors and one end of said diodes, and a sixth transistor of said first conductivity type and having a base-emitter path connected between said common connection point between said third and fourth resistors and the other end of said diodes;

a first input terminal connected to said bases of said first and third transistors;

a second input terminal connected to said bases of said second and fourth transistors;

a first output terminal connected to at least one of said collectors of said first and second transistors; and a second output terminal connected to at least one of said collectors of said third and fourth transistors.

* * * * *